United States Patent
Yamawaku et al.

(10) Patent No.: US 8,516,715 B2
(45) Date of Patent: Aug. 27, 2013

(54) EVACUATION METHOD AND STORAGE MEDIUM

(75) Inventors: Jun Yamawaku, Nirasaki (JP); Tsuyoshi Moriya, Nirasaki (JP); Hideaki Yakushiji, Nirasaki (JP); Kazumasa Abe, Hsin-chu (TW)

(73) Assignee: Tokyo Electron Limited, Tokyo (JP)

( * ) Notice: Subject to any disclaimer, the term of this patent is extended or adjusted under 35 U.S.C. 154(b) by 998 days.

(21) Appl. No.: 12/134,604

(22) Filed: Jun. 6, 2008

(65) Prior Publication Data
US 2008/0301972 A1    Dec. 11, 2008

Related U.S. Application Data

(60) Provisional application No. 60/970,548, filed on Sep. 7, 2007.

(30) Foreign Application Priority Data

Jun. 7, 2007   (JP) .................................. 2007-151501

(51) Int. Cl.
*F26B 5/04*   (2006.01)
(52) U.S. Cl.
USPC ................... 34/402; 34/403; 34/404; 34/406; 34/410
(58) Field of Classification Search
USPC ................... 34/403, 404, 409, 410, 413, 415, 34/402
See application file for complete search history.

(56) References Cited

U.S. PATENT DOCUMENTS

| | | | | |
|---|---|---|---|---|
| 4,723,363 A | * | 2/1988 | Seelbach et al. | 34/339 |
| 5,369,137 A | * | 11/1994 | Paquet et al. | 521/146 |
| 2004/0074769 A1 | * | 4/2004 | Morinaka et al. | 204/298.07 |
| 2006/0100825 A1 | * | 5/2006 | Furuya et al. | 702/185 |

FOREIGN PATENT DOCUMENTS

| | | | |
|---|---|---|---|
| CN | 1661433 A | * | 8/2005 |
| JP | 63-241171 | | 10/1988 |
| JP | 5-312471 | | 11/1993 |
| JP | 11-165060 | | 6/1999 |
| JP | 2000-58543 | | 2/2000 |
| JP | 2000-182966 | | 6/2000 |
| JP | 2002-249876 | | 9/2002 |
| TW | 440955 | | 6/2001 |
| WO | WO 2007/004443 A1 | | 1/2007 |

OTHER PUBLICATIONS

Office Action issued Sep. 13, 2011, in Japanese Patent Application No. 2007-151501 (with English-language translation).

* cited by examiner

*Primary Examiner* — Jiping Lu

(74) *Attorney, Agent, or Firm* — Oblon, Spivak, McClelland, Maier & Neustadt, L.L.P.

(57) ABSTRACT

An evacuation method which can reduce evacuation time without causing moisture-related problems. In a vacuum processing apparatus including a vacuum processing chamber, during the evacuation for the vacuum processing chamber, the pressure in the vacuum processing chamber is maintained at a pressure lower than or equal to the atmospheric pressure but higher than or equal to $6.7 \times 10^2$ Pa (5 Torr).

15 Claims, 4 Drawing Sheets

EVACUATION METHOD AND STORAGE MEDIUM

BACKGROUND OF THE INVENTION

1. Field of the Invention

The present invention relates to an evacuation method and a storage medium, and more particularly, to an evacuation method for a vacuum processing apparatus including a vacuum processing chamber with moisture attached to a wall and a component surfaces of the chamber.

2. Description of the Related Art

A vacuum processing apparatus, for example, a plasma processing apparatus, includes a vacuum processing chamber that accommodates a wafer as a substrate and performs plasma processing, such as etching, on the wafer. When plasma processing is repeatedly performed, deposits are attached to the wall and the component surfaces of the chamber. To remove such deposits on a regular basis, it is necessary to clean the wall and the component surfaces, specifically, wipe them with a cloth containing alcohol or other solvents. In this process, since an operator needs to access the internal space of the chamber with his/her arm, the chamber is exposed to the atmosphere. When the chamber is exposed to the atmosphere, moisture in the atmosphere is attached to the wall and the component surfaces of the chamber.

After the cleaning, the chamber is evacuated. However, after the air and other gases are discharged from the chamber, the moisture attached to the wall and the component surfaces is evaporated and released (degassed), disadvantageously resulting in an increased time required for the evacuation.

To reduce the time required for the evacuation, a variety of evacuation methods have been developed. For example, in one of such methods, after the evacuation is initiated, a dry inert gas is temporarily introduced into the chamber to create a positive pressure state, the positive pressure being at least the atmospheric pressure, and then the evacuation is continued (see Japanese Laid-Open Patent Publication (Kokai) No. 2002-249876). According to this method, the introduction of the dry inert gas facilitates sweeping and replacing the moisture attached to the wall, and hence the evacuation time is reduced.

However, even when the above evacuation method is used, after the chamber has been depressurized and the air and other gases have been discharged, the moisture attached to the wall and the component surfaces begins to evaporate. Further depressurization of the chamber causes adiabatic expansion, so that the temperature of the moisture decreases and eventually becomes below zero degrees. In this state, the moisture that has not evaporated may solidify.

The moisture that has solidified will not readily evaporate during the evacuation (in fact, the present inventor has conducted an experiment and found that the discharged gas has the greatest amount of moisture at a pressure around a target pressure of $1.3 \times 10^{-3}$ Pa ($1 \times 10^{-5}$ Torr)). That is, the moisture that has solidified keeps evaporating but confines moisture that has not solidified and been housed in tiny recesses formed in the wall and other surfaces for an extended period of time. Therefore, the evacuation still disadvantageously requires a long period of time even if the above-mentioned method is used.

Further, the moisture that has solidified causes other moisture-related problems, for example, generation of particles, abnormal discharge, and erosion of the components.

SUMMARY OF THE INVENTION

The present invention provides an evacuation method and a storage medium by which evacuation time can be reduced without causing moisture-related problems.

Accordingly, in a first aspect of the present invention, there is provided an evacuation method for a vacuum processing apparatus including a vacuum processing chamber, the method comprising a first pressure adjustment step of maintaining the pressure in the vacuum processing chamber during the evacuation at a pressure lower than or equal to the atmospheric pressure but higher than or equal to $6.7 \times 10^2$ Pa (5 Torr).

According to the first aspect of the present invention, the pressure in the vacuum processing chamber during the evacuation is maintained at a pressure lower than or equal to the atmospheric pressure but higher than or equal to $6.7 \times 10^2$ Pa (5 Torr). The pressure at the triple point on the moisture vapor pressure curve is $6.1 \times 10^2$ Pa (4.6 Torr). The triple point is a critical point where moisture that has not evaporated (moisture that has liquefied) solidifies as the temperature of the moisture decreases due to adiabatic expansion. That is, since the pressure in the vacuum processing chamber will not be lower than the pressure at the triple point during the evacuation, it is possible in the vacuum processing chamber to prevent the moisture from solidifying, facilitate discharging the moisture, and hence reduce the evacuation time without causing moisture-related problems.

The first aspect of the present invention can provide the evacuation method further comprising a second pressure adjustment step of elevating the pressure in the vacuum processing chamber to a pressure higher than the pressure in the first pressure adjustment step but lower than or equal to the atmospheric pressure, the second pressure adjustment step carried out after the first pressure adjustment step.

According to the first aspect of the present invention, the evacuation method further comprises the second pressure adjustment step of elevating the pressure in the vacuum processing chamber to a pressure higher than the pressure in the first pressure adjustment step but lower than or equal to the atmospheric pressure, the second pressure adjustment step carried out after the first pressure adjustment step in which the pressure in the vacuum processing chamber is maintained at a pressure lower than or equal to the atmospheric pressure but higher than or equal to $6.7 \times 10^2$ Pa (5 Torr). When the pressure in the vacuum processing chamber is elevated to a pressure higher than the pressure in the first pressure adjustment step but lower than or equal to the atmospheric pressure, the temperature of the atmosphere in the vacuum processing chamber increases due to adiabatic compression, and hence the moisture is heated. It is therefore possible to prevent the temperature of the moisture from being lower than the temperature at the triple point, and hence reliably prevent the moisture from solidifying in the vacuum processing chamber.

The first aspect of the present invention can provide the evacuation method, wherein the first and second pressure adjustment steps are repeated.

According to the first aspect of the present invention, the first and second pressure adjustment steps are repeated. That is, facilitating discharge of the moisture and heating the moisture to prevent it from solidifying are repeated. As a result, the evacuation time can be further reduced.

The first aspect of the present invention can provide the evacuation method, wherein a heated gas or a room-temperature inert gas is introduced into the vacuum processing chamber.

According to the first aspect of the present invention, the heated gas or the room-temperature inert gas is introduced into the vacuum processing chamber. It is therefore possible to reliably prevent the temperature of the moisture from being lower than the temperature at the triple point, and hence more reliably prevent the moisture from solidifying in the vacuum processing chamber.

The first aspect of the present invention can provide the evacuation method, wherein a moisture decomposing gas is introduced into the vacuum processing chamber.

According to the first aspect of the present invention, since the moisture decomposing gas is introduced into the vacuum processing chamber, decomposition of the moisture that has evaporated is facilitated. As a result, since the partial pressure of the moisture decreases, it is possible to facilitate evaporation of the moisture attached to the wall and the component surfaces.

The first aspect of the present invention can provide the evacuation method, wherein the atmosphere in the vacuum processing chamber is replaced with a low oxygen partial pressure atmosphere.

According to the first aspect of the present invention, the atmosphere in the vacuum processing chamber is replaced with the low oxygen partial pressure atmosphere. In this process, since the moisture is decomposed and hence the partial pressure of the moisture decreases, it is possible to facilitate evaporation of the moisture attached to the wall and the component surfaces.

The first aspect of the present invention can provide the evacuation method, wherein the wall and the component surfaces of the vacuum processing chamber are heated.

According to the first aspect of the present invention, since the wall and the component surfaces of the vacuum processing chamber are heated, it is possible to prevent the moisture that has evaporated from liquefying, solidifying, and then attaching again to the wall and the component surfaces.

The first aspect of the present invention can provide the evacuation method, wherein a cryopump capable of evacuating the vacuum processing chamber is disposed therein, and wherein the evacuation is continued after the first pressure adjustment step to depressurize the vacuum processing chamber to $1.3 \times 10$ Pa (0.1 Torr) or lower, and the cryopump is then activated.

According to the first aspect of the present invention, the evacuation is continued after the first pressure adjustment step to depressurize the vacuum processing chamber to $1.3 \times 10$ Pa (0.1 Torr) or lower, and then the cryopump is activated. Since the cryopump adsorbs moisture in a low-pressure atmosphere, it is possible to lower the partial pressure of the moisture in the low-pressure atmosphere and hence facilitate evaporation of the moisture attached to the wall and the component surfaces.

The first aspect of the present invention can provide the evacuation method further comprising the steps of continuing the evacuation after the first pressure adjustment step to depressurize the vacuum processing chamber to $1.3 \times 10^{-2}$ Pa (0.1 mTorr) or lower, and repeating a third pressure adjustment step of introducing an inert gas into the vacuum processing chamber while evacuating the vacuum processing chamber and a fourth pressure adjustment step of discharging the inert gas in the vacuum processing chamber to depressurize the vacuum processing chamber to $1.3 \times 10^{-2}$ Pa (0.1 mTorr) or lower.

According to the first aspect of the present invention, the evacuation is continued after the first pressure adjustment step to depressurize the vacuum processing chamber to $1.3 \times 10^{-2}$ Pa (0.1 mTorr) or lower, and the following two steps are repeated: the third pressure adjustment step of introducing the inert gas into the vacuum processing chamber while evacuating the vacuum processing chamber and the fourth pressure adjustment step of discharging the inert gas in the vacuum processing chamber to depressurize the vacuum processing chamber to $1.3 \times 10^{-2}$ Pa (0.1 mTorr) or lower. When the third and fourth pressure adjustment steps are repeated, the atmosphere in the vacuum processing chamber is cooled due to adiabatic expansion. It is therefore possible to smoothly shift to vacuum processing that is initiated at a relatively low temperature. Further, pressure pulsation occurs in the vacuum processing chamber and hence a viscous flow is produced, so that a gas viscous force imparted by the viscous flow can remove particles in the vacuum processing chamber.

Accordingly, in a second aspect of the present invention, there is provided an evacuation method for a vacuum processing apparatus including a vacuum processing chamber, the method comprising a depressurization step of depressurizing the vacuum processing chamber without causing the moisture in the vacuum processing chamber to solidify, and a pressure elevation step of allowing adiabatic compression to occur in the vacuum processing chamber.

According to the second aspect of the present invention, the vacuum processing chamber is depressurized without causing the moisture in the vacuum processing chamber to solidify, and adiabatic compression is allowed to occur in the vacuum processing chamber. That is, it is possible to prevent the moisture from solidifying to facilitate discharging the moisture. At the same time, it is possible to heat the moisture by elevating the temperature of the atmosphere in the vacuum processing chamber through adiabatic compression, and hence prevent the temperature of the moisture from being lower than the temperature at the triple point on the moisture vapor pressure curve. The triple point is a critical point where moisture that has not evaporated (moisture that has liquefied) solidifies as the temperature of the moisture decreases due to adiabatic expansion. As a result, the evacuation time can be reduced without causing moisture-related problems.

The second aspect of the present invention can provide the evacuation method, wherein the depressurization step and the pressure elevation step are repeated.

According to the second aspect of the present invention, the following two steps are repeated: the depressurization step of depressurizing the vacuum processing chamber without causing the moisture in the vacuum processing chamber to solidify and the pressure elevation step of allowing adiabatic compression to occur in the vacuum processing chamber. That is, facilitating discharge of the moisture and heating the moisture to prevent it from solidifying are repeated. As a result, the evacuation time can be further reduced.

Accordingly, in a third aspect of the present invention, there is provided a computer-readable storage medium storing a program adapted to cause a computer to carry out an evacuation method for a vacuum processing apparatus including a vacuum processing chamber, the evacuation method comprising a first pressure adjustment step of maintaining the pressure in the vacuum processing chamber during the evacuation at a pressure lower than or equal to the atmospheric pressure but higher than or equal to $6.7 \times 10^2$ Pa (5 Torr).

Accordingly, in a fourth aspect of the present invention, there is provided a computer-readable storage medium storing a program adapted to cause a computer to carry out an evacuation method for a vacuum processing apparatus including a vacuum processing chamber, the evacuation method comprising a depressurization step of depressurizing the vacuum processing chamber without causing the moisture in the vacuum processing chamber to solidify, and a pressure elevation step of allowing adiabatic compression to occur in the vacuum processing chamber.

The features and advantages of the invention will become more apparent from the following detailed description taken in conjunction with the accompanying with drawings.

DETAILED DESCRIPTION OF THE PREFERRED EMBODIMENTS

The present invention will be described below in detail with reference to the drawings showing a preferred embodiment thereof.

Figure 1:
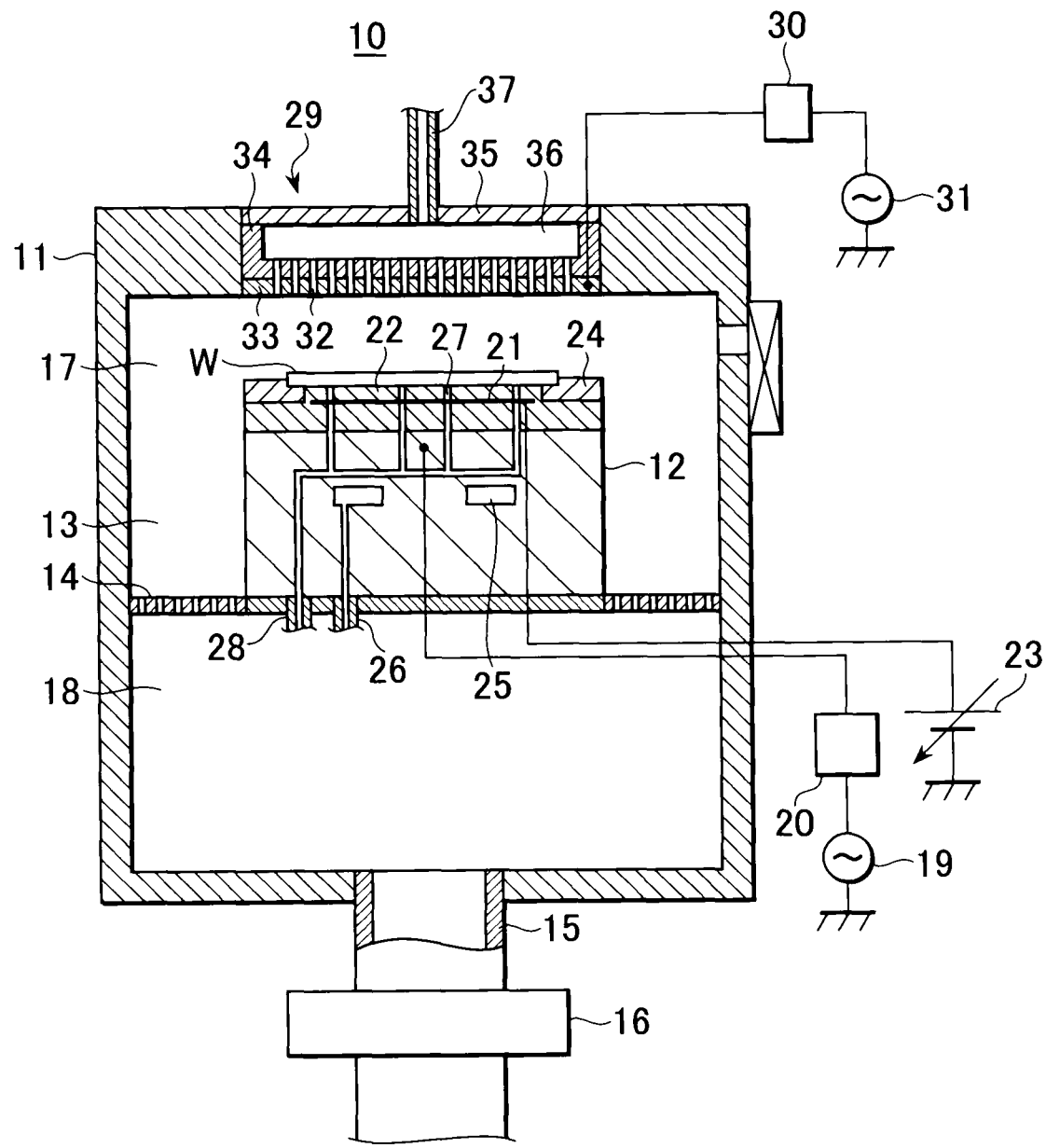
FIG. 1 is a cross-sectional view schematically showing the configuration of a vacuum processing apparatus to which an evacuation method according to an embodiment of the present invention is applied.

FIG. 1 is a cross-sectional view schematically showing the configuration of a vacuum processing apparatus to which an evacuation method according to the embodiment is applied. The vacuum processing apparatus is configured to perform etching, which is an example of vacuum processing, on a semiconductor wafer as a substrate.

In FIG. 1, the vacuum processing apparatus 10 includes a chamber 11 (vacuum processing chamber) that accommodates a semiconductor wafer (hereinafter simply referred to as "wafer") W having a diameter of, for example, 300 mm, and a cylindrical susceptor 12 on which the wafer W is mounted is disposed in the chamber 11. In the vacuum processing apparatus 10, the inner side wall of the chamber 11 and the side surface of the susceptor 12 form a side discharge path 13 that functions as a path through which the gas above the susceptor 12 is discharged out of the chamber 11. A discharge plate 14 is disposed part way along the side discharge path 13.

The discharge plate 14 is a plate-shaped member having a large number of holes, and functions as a partition plate that partitions the chamber 11 into upper and lower portions. In the upper portion (hereinafter referred to as "reaction compartment") 17 of the chamber 11, which is partitioned by the discharge plate 14, plasma is produced as will be described later. The lower portion (hereinafter referred to as "discharge compartment (manifold)") 18 of the chamber 11 has a discharge pipe 15 connected thereto via an adaptive pressure control (APC) valve 16, the discharge pipe 15 discharging the gas in the chamber 11. The discharge plate 14 traps or reflects the plasma produced in the reaction compartment 17 and hence prevents the plasma from leaking into the manifold 18.

The discharge pipe 15 is connected to a turbo molecular pump (TMP) and a dry pump (DP) (both the pumps are not shown), which evacuate and depressurize the chamber 11. Specifically, the DP depressurizes the chamber 11 from the atmospheric pressure to a medium vacuum state ($1.3 \times 10$ Pa (0.1 Torr) or lower, for example), and the TMP cooperates with the DP to depressurize the chamber 11 to a high vacuum state, the pressure in which is lower than that in the medium vacuum state, ($1.3 \times 10^{-3}$ Pa ($1.0 \times 10^{-5}$ Torr) or lower, for example). The pressure in the chamber 11 is controlled by the APC valve 16.

A lower high-frequency power supply 19 is connected to the susceptor 12 in the chamber 11 via a lower matcher 20. The lower high-frequency power supply 19 supplies predetermined high-frequency power to the susceptor 12. The susceptor 12 therefore functions as a lower electrode. The lower matcher 20 reduces reflection of the high-frequency power from the susceptor 12 to maximize the efficiency in supplying the high-frequency power to the susceptor 12.

An electrostatic chuck 22 having an electrostatic electrode plate 21 therein is disposed in the upper portion of the susceptor 12. The electrostatic chuck 22 is formed of a lower disc-shaped member having a certain diameter and an upper disc-shaped member mounted thereon and having a diameter smaller than that of the lower disc-shaped member. The electrostatic chuck 22 is made of aluminum, and a ceramic material or any other material is thermally sprayed on the upper surface of the electrostatic chuck 22. When the wafer W is mounted on the susceptor 12, the wafer W is mounted on the upper disc-shaped member of the electrostatic chuck 22.

A DC power supply 23 is electrically connected to the electrostatic electrode plate 21 in the electrostatic chuck 22. When a high positive DC voltage is applied to the electrostatic electrode plate 21, a negative potential is produced on the surface of the wafer W that faces the electrostatic chuck 22 (hereinafter referred to as "backside"). A potential difference is thus generated between the electrostatic electrode plate 21 and the backside of the wafer W, and a coulomb force or a Johnsen-Rahbek force resulting from the potential difference attracts and holds the wafer W on the upper disc-shaped member of the electrostatic chuck 22.

An annular focus ring 24 is disposed on the electrostatic chuck 22 so as to surround the attracted, held wafer W. The focus ring 24 is made of a conductive material, such as silicon, and focuses the plasma in the reaction compartment 17 toward the topside of the wafer W to improve the efficiency of the etching.

An annular coolant compartment 25 extending, for example, in the circumferential direction of the susceptor 12 is provided in the susceptor 12. A circulating low-temperature coolant, such as chilled water and Galden (registered trademark), is supplied to the coolant compartment 25 from a chiller unit (not shown) through a coolant tube 26. The susceptor 12 cooled by the low-temperature coolant cools the wafer W and the focus ring 24 via the electrostatic chuck 22.

A plurality of heat-transfer gas supply holes 27 are formed in the portion of the upper disc-shaped member of the electrostatic chuck 22 where the wafer W is attracted and held (hereinafter referred to as "attracting surface"). The plurality of heat-transfer gas supply holes 27 are connected to a heat-transfer gas supplier (not shown) through a heat-transfer gas supply line 28, and the heat-transfer gas supplier supplies helium (He) gas as a heat-transfer gas to the gap between the attracting surface and the backside of the wafer W through the heat-transfer gas supply holes 27. The helium gas supplied to gap between the attracting surface and the backside of the wafer W effectively transfers heat from the wafer W to the electrostatic chuck 22.

A shower head 29 is disposed at the ceiling of the chamber 11 so as to face the susceptor 12. The shower head 29 is connected to an upper high-frequency power supply 31 via an upper matcher 30, and the upper high-frequency power supply 31 supplies predetermined high-frequency power to the shower head 29, which therefore functions as an upper electrode. The function of the upper matcher 30 is the same as that of the lower matcher 20 described above.

The shower head 29 includes a ceiling electrode plate 33 having a large number of gas holes 32, a cooling plate 34 from which the ceiling electrode plate 33 is detachably suspended, and a lid 35 that covers the cooling plate 34. A buffer compartment 36 is provided in the cooling plate 34, and a process gas introduction tube 37 is connected to the buffer compartment 36. In the shower head 29, a process gas supplied into the buffer compartment 36 through the process gas introduction tube 37 is supplied into the reaction compartment 17 through the gas holes 32.

The shower head 29, which is detachably attached to the chamber 11, functions as a lid of the chamber 11. Removing the shower head 29 from the chamber 11 allows the operator to directly access the wall and the components of the chamber 11 and hence can clean the wall and the component surfaces of the chamber 11 (hereinafter simply referred to as "the wall and other surfaces of the chamber 11"). In this way, deposits attached to the wall and other surfaces of the chamber 11 can be removed.

In the vacuum processing apparatus 10, high-frequency power is supplied to the susceptor 12 and the shower head 29, so that the high-frequency power is applied to the reaction compartment 17. As a result, in the reaction compartment 17, the process gas supplied through the shower head 29 is converted into high-density plasma, which etches the wafer W.

The vacuum processing apparatus 10 further includes a heating mechanism (not shown) that heats the wall and other surfaces of the chamber 11. The heating mechanism heats the wall and other surfaces of the chamber 11. Further, a cryopump (not shown) is disposed in the vacuum processing apparatus 10, so that the chamber 11 can be evacuated. The operation of a cryopump is based on a physical property according to which moisture that has evaporated gathers in a low-temperature region. The cryopump includes a cold trap where a low temperature is maintained, causes moisture attached to the surface of the cold trap to solidify, and then traps the moisture that has solidified. The cryopump thus lowers the partial pressure of the moisture in the chamber 11.

The operation of the components of the vacuum processing apparatus 10 described above is controlled by a CPU in a control unit (not shown) of the vacuum processing apparatus 10 in accordance with a program for the etching process.

In the vacuum processing apparatus 10, when the shower head 29 is removed from the chamber 11 in order to clean the wall and other surfaces of the chamber 11, the chamber is exposed to the atmosphere, so that the moisture in the atmosphere attaches to the wall and the component surfaces. When the cleaning is completed and the TMP and the DP are subsequently used to evacuate the chamber 11 as described above, the moisture in the chamber 11 may solidify due to the reduction in pressure in the chamber 11. This phenomenon will be described with reference to the following moisture vapor pressure curve.

Figure 2:
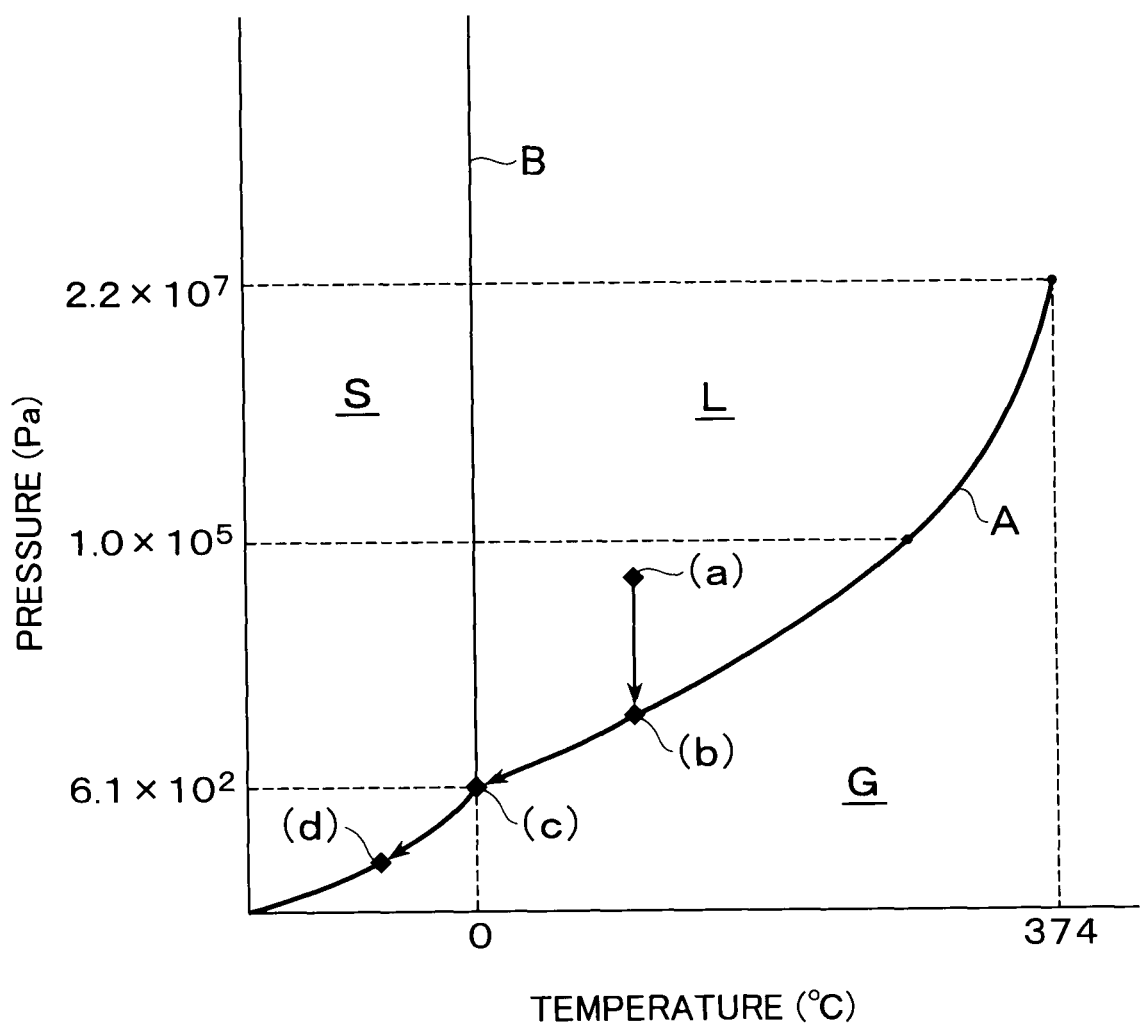
FIG. 2 is a view showing a moisture vapor pressure curve.

FIG. 2 is a view showing the moisture vapor pressure curve. The horizontal axis represents temperature, and the vertical axis represents pressure.

In FIG. 2, moisture evaporates in the area G surrounded by the curve A and the horizontal axis, whereas moisture liquefies in the area L surrounded by the curve A and the straight line B. Moisture solidifies in the area S surrounded by the curve A, the straight line B, and the vertical axis.

In the state in which gas is left in the chamber 11 ((a) in the area L), evacuation is initiated by using the TMP and the DP. After the gas in the chamber 11 is discharged, the moisture attached to the wall and other surfaces of the chamber 11 boils and evaporates ((b) on the curve A). In particular, when the pressure in the chamber 11 is rapidly lowered, the moisture abruptly boils.

The pressure in the chamber 11 is further lowered as the evacuation performed by the TMP and the DP continues, so that the temperature decreases while the moisture still boils (from (b) to (c) on the curve A). When the temperature reaches substantially 0° C. ((c) on the curve A: the triple point of water), the moisture that has not evaporated solidifies. When the moisture solidifies, the bonding strength between water molecules becomes stronger, so that evaporation hardly occurs even at an elevated pressure (that is, the moisture that has solidified will not readily evaporate). At a further lowered pressure, the temperature decreases to approximately −30° C. ((d) on the curve A).

In the embodiment, to prevent the moisture attached to the wall and other surfaces of the chamber 11 from solidifying when the chamber 11 is evacuated, the pressure in the chamber 11 is controlled. Specifically, when the DP is used to evacuate the chamber 11, the APC valve 16 is used to maintain the pressure in the chamber 11 at least at $6.7 \times 10^2$ Pa (5 Torr) or higher.

Figure 3:
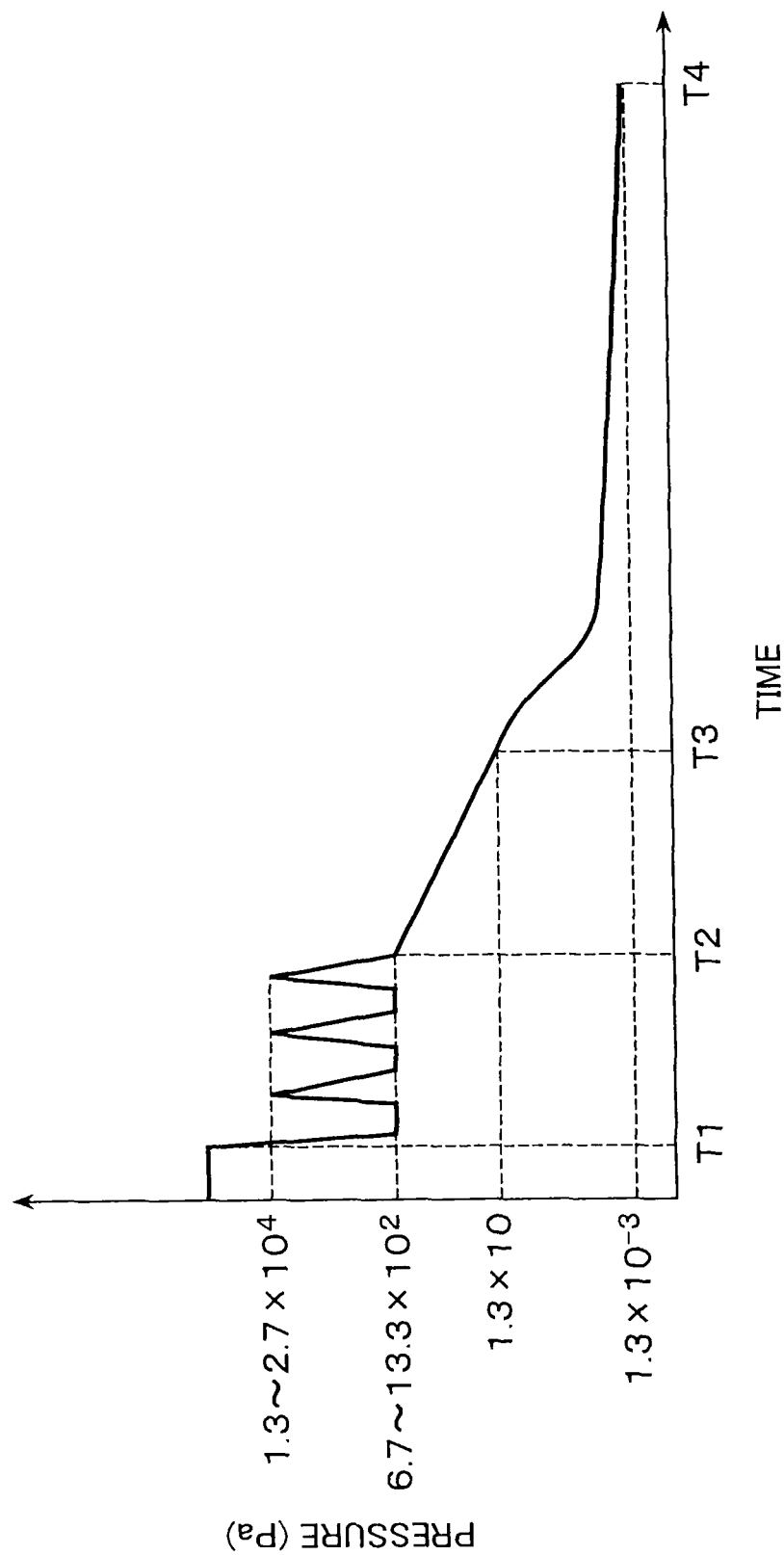
FIG. 3 is a pressure transition diagram showing a depressurization process as the evacuation method according to the embodiment.

FIG. 3 is a pressure transition diagram showing a depressurization process as the evacuation method according to the embodiment. In FIG. 3, the horizontal axis represents time, and the vertical axis represents the pressure in the chamber 11. The depressurization process is carried out after the wall and other surfaces of the chamber 11 are cleaned in the vacuum processing apparatus 10.

First, in the vacuum processing apparatus 10, the shower head 29 is attached to the chamber 11 and evacuation of the chamber 11 is initiated by using the DP (time T1). In this process, when the gas in the chamber 11 is completely discharged, the moisture attached to the wall and other surfaces of the chamber 11 boils and evaporates. Since the evacuation of the chamber 11 continues, the temperature of the moisture decreases due to adiabatic expansion.

When the pressure in the chamber 11 decreases to $6.7 \times 10^2$ Pa (5 Torr), the APC valve 16 is used to maintain the pressure in the chamber 11 at a pressure in the range between 6.7 and $13.3 \times 10$ Pa (5 to 10 Torr) (which is lower than or equal to the atmospheric pressure but higher than or equal to $6.7 \times 10^2$ Pa) for a predetermined period of time, for example, several tens of seconds (first pressure adjustment step).

The pressure at the triple point on the moisture vapor pressure curve ((c) on the curve A in FIG. 2) is $6.1 \times 10^2$ Pa (4.6 Torr). The triple point is a critical point where boiling moisture solidifies as the temperature of the moisture decreases due to adiabatic expansion. In the embodiment, since the pressure in the chamber 11 will not be lower than the pressure at the triple point, the moisture that is attached to the wall and other surfaces of the chamber 11 and has not yet evaporated will not solidify. That is, the chamber 11 can be depressurized without causing the moisture in the chamber 11 to solidify by maintaining the pressure in the chamber 11 at a pressure in the range between 6.7 and $13.3 \times 10^2$ Pa (depressurization step). In this step, since the moisture does not solidify, it is possible to continue evaporation of the moisture attached to the wall and other surfaces of the chamber 11, and hence facilitate discharging the moisture from the chamber 11.

A heated gas is then rapidly introduced into the chamber 11 to rapidly elevate the pressure in the chamber 11 to a pressure in the range between 1.3 and $2.7 \times 10^4$ Pa (100 to 200 Torr) (which is higher than the pressure in the first pressure adjustment step but lower than or equal to the atmospheric pressure) (second pressure adjustment step, pressure elevation step). When the pressure in the chamber 11 is rapidly elevated to a pressure in the range between 1.3 and $2.7 \times 10^4$ Pa, the temperature of the atmosphere in the chamber 11 increases due to adiabatic compression. The moisture attached to the wall and other surfaces of the chamber 11 is thus heated, and the temperature of the moisture increases. Therefore, even when the temperature of the moisture decreases to a temperature around the temperature at the triple point due to the adiabatic expansion during the period in which the pressure in the chamber 11 is maintained at a pressure in the range between 6.7 and $13.3 \times 10^2$ Pa, it is possible to prevent the temperature of the moisture from being lower than the temperature at the triple point.

Next, during the time frame from the time T1 to the time T2, the step of maintaining the pressure in the chamber 11 at a pressure in the range between 6.7 and $13.3 \times 10^2$ Pa (hereinafter simply referred to as "pressure maintenance") and the step of rapidly elevating the pressure in the chamber 11 to a pressure in the range between 1.3 and $2.7 \times 10^4$ Pa (hereinafter simply referred to as "rapid pressure elevation") are repeated multiple times, for example, three times, (cycle purge). The period of time required for one cycle of the pressure maintenance and the subsequent rapid pressure elevation is, for example, one minute. During the time frame from the time T1 to the time T2, the heating mechanism heats the wall and other surfaces of the chamber 11.

After the cycle purge described above is completed, the DP is used to continue the evacuation of the chamber 11 (from the time T2 to the time T3). When the pressure becomes lower than $1.3 \times 10$ Pa (0.1 Torr), the TMP is activated. Thereafter (from the time T3 forward), the cryopump is activated while the DP and the TMP continue the evacuation. The cryopump lowers the partial pressure of the moisture in the chamber 11.

When the pressure in the chamber 11 decreases to a target pressure of $1.3 \times 10^{-3}$ Pa ($1 \times 10^{-5}$ Torr), the process is terminated (time T4).

According to the process shown in FIG. 3, since the pressure in the chamber 11 is maintained at a pressure in the range between 6.7 and $13.3 \times 10^2$ Pa during the evacuation, it is possible in the chamber 11 to prevent the moisture from solidifying, facilitate discharging the moisture, and hence reduce the evacuation time without causing moisture-related problems.

Further, according to the process shown in FIG. 3, since the pressure maintenance is followed by the rapid pressure elevation in the chamber 11 to a pressure in the range between 1.3 and $2.7 \times 10^4$ Pa, it is possible to prevent the temperature of the moisture from being lower than the temperature at the triple point, and hence reliably prevent the moisture from solidifying in the chamber 11.

In the process in FIG. 3 described above, the pressure maintenance and the rapid pressure elevation are repeated multiple times. That is, facilitating discharge of the moisture and heating the moisture to prevent it from solidifying are repeated. As a result, the evacuation time can be further reduced.

Further, in the process in FIG. 3 described above, since the heated gas is introduced into the chamber 11, the wall and the components of the chamber 11 are heated. It is therefore possible to reliably prevent the temperature of the moisture attached to the wall and the component surfaces from being lower than the temperature at the triple point.

Moreover, in the process in FIG. 3 described above, since the heating mechanism heats the wall and other surfaces of the chamber 11, it is possible to prevent the moisture that has evaporated and separated from the wall and other surfaces of the chamber 11 from liquefying and solidifying and then attaching again to the wall and other surfaces.

In the process in FIG. 3 described above, after the pressure maintenance and the rapid pressure elevation are completed, the evacuation continues to depressurize the chamber 11 to $1.3 \times 10$ Pa or lower, and then the cryopump is activated. It is therefore possible to lower the partial pressure of the moisture and hence facilitate evaporation of the moisture attached to the wall and other surfaces of the chamber 11.

In the process in FIG. 3 described above, the heated gas is introduced into the chamber 11 to rapidly elevate the pressure. The gas to be introduced, however, is not necessarily heated as long as the temperature of the gas to be introduced is higher than the temperature of the moisture. For example, the gas to be introduced may be at room temperature (approximately 20° C.). The gas to be introduced to rapidly elevate the pressure (including a room-temperature gas) is preferably an inert gas. A moisture decomposing gas may be introduced instead of the heated gas. Examples of the moisture decomposing gas are iodomethylpropane, acetyl chloride, acetone diacyl acetal, dichloropropane, dimethylpropane, dibromopropane, trimethyldisilane, dimethyldichlorosilane, monomethyltrichlorosilane, and tetrachlorosilane. Any of these gases facilitates decomposing moisture that has evaporated. As a result, the partial pressure of the moisture decreases in the chamber 11. It is therefore possible to facilitate evaporation of the moisture attached to the wall and other surfaces of the chamber 11.

Among the gases described above, methylsilane compounds are particularly desired from the viewpoint of the moisture decomposition efficiency. A heated moisture decomposing gas may be introduced, which allows the wall and other surfaces of the chamber 11 to be heated and the partial pressure of the moisture in the chamber 11 to be lowered at the same time.

In the process in FIG. 3 described above, although the pressure in the chamber 11 is always maintained at $6.7 \times 10^2$ Pa or higher in the pressure maintenance, the pressure may be lower than $6.7 \times 10^2$ Pa only for a short duration. The moisture unlikely solidifies in a short duration, and even when the moisture solidifies, heating in the rapid pressure elevation step can cause the moisture that has solidified to evaporate or liquefy.

Figure 4:
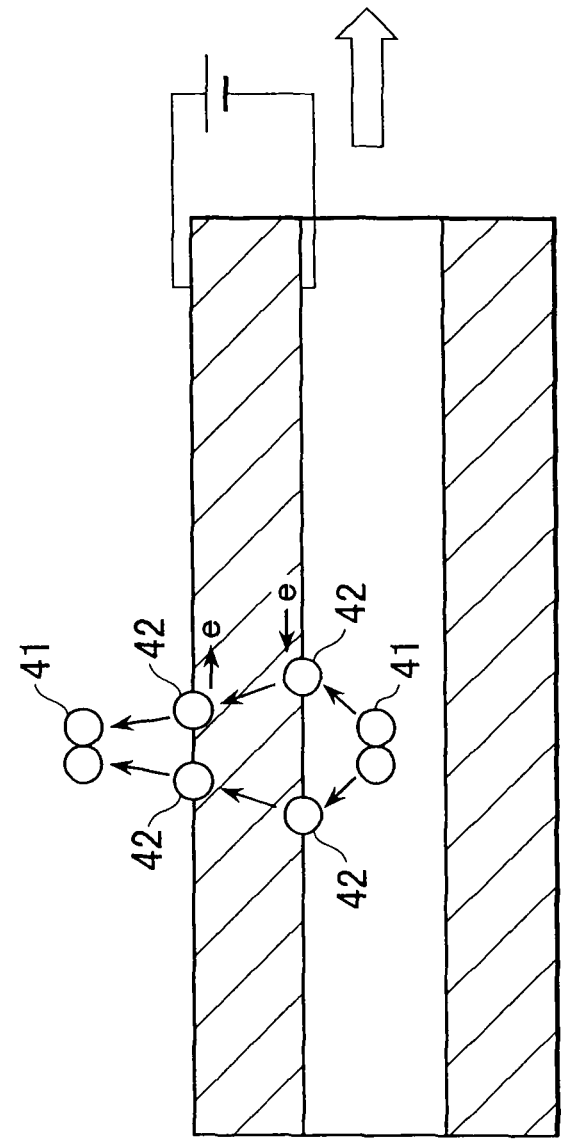
FIG. 4 is a cross-sectional view schematically showing the configuration of an oxygen partial pressure super-reduction pipe.

In the process in FIG. 3 described above, during the pressure maintenance and rapid pressure elevation, the atmosphere in the chamber 11 may be replaced with a low oxygen partial pressure atmosphere. Specifically, a circulating channel (not shown) that circulates the atmosphere in the chamber 11 is attached to the vacuum processing apparatus 10, and an oxygen partial pressure super-reduction pipe 40 shown in FIG. 4 is provided in the circulating channel. The oxygen partial pressure super-reduction pipe 40 is made of a solid electrolyte, for example, zirconia, and the inner surface of the pipe is covered with a platinum electrode (not shown). A DC voltage is applied to the oxygen partial pressure super-reduction pipe 40 so as to produce a potential difference between the inner surface (platinum electrode) and the outer surface.

An oxygen molecule 41 in the atmosphere in the chamber 11 that passes through the oxygen partial pressure super-reduction pipe 40 receives electrons from the platinum electrode and is decomposed into oxygen ions 42, as shown in the following chemical formula (1):

$$O_2 + 4e \rightarrow 2O^{2-} \quad (1)$$

The potential difference directs the decomposed oxygen ions 42 toward the outer surface of the oxygen partial pressure super-reduction pipe 40. The oxygen ions 42, when reach the outer surface, are converted into an oxygen molecule 41 as shown in the following chemical formula (2) and discharged from the oxygen partial pressure super-reduction pipe 40.

$$2O^{2-} \rightarrow O_2 + 4e \quad (2)$$

The oxygen partial pressure super-reduction pipe 40 can separate oxygen atoms not only from oxygen molecules but also from oxygen compounds in accordance with the same principle described above and discharge the separated oxygen atoms as oxygen molecules. That is, oxygen atoms can be separated from the moisture that has evaporated in the chamber 11, so that the atmosphere in the chamber 11 can be replaced with a low oxygen partial pressure atmosphere. In this process, since the moisture from which oxygen atoms are separated becomes hydrogen gas, the amount of moisture in the chamber 11 decreases, resulting in reduction in partial pressure of the moisture in the chamber 11. It is therefore possible to facilitate evaporation of the moisture attached to the wall and other surfaces of the chamber 11.

In the process in FIG. 3 described above, although the evacuation continues even after the pressure becomes lower than $1.3 \times 10$ Pa, the following steps may instead be repeated: the step of introducing an inert gas into the chamber 11 (third pressure adjustment step), and the step of discharging the inert gas in the chamber 11 to rapidly depressurize the chamber 11 to $1.3 \times 10^{-2}$ Pa (0.1 mTorr) or lower (fourth pressure adjustment step). When the steps of introducing the inert gas into the chamber 11 and rapidly depressurizing the chamber 11 to $1.3 \times 10^{-2}$ Pa are repeated, the atmosphere in the chamber 11 is cooled due to adiabatic expansion. It is therefore possible to smoothly shift to the etching process that is initiated at a relatively low temperature. Further, pressure pulsation occurs in the chamber 11 and hence a viscous flow is produced, so that a gas viscous force imparted by the viscous flow can remove particles in the chamber 11.

In the above embodiment, while the vacuum processing apparatus to which the evacuation method according to the embodiment is applied is an etching apparatus, the vacuum processing apparatus is not limited thereto. For example, the vacuum processing apparatus may be a film forming apparatus.

The object of the present invention can also be accomplished by supplying a computer with a storage medium on which software program code for achieving the functions obtained in the embodiment described above is recorded, and causing a CPU in the computer to read and execute the program code stored on the storage medium.

In this case, the program code itself read from the storage medium achieves the functions obtained in the embodiment, and the program code and the storage medium on which the program code is stored constitute the present invention.

The storage medium for supplying a program code may be those capable of storing the program code, for example, a RAM, an NV-RAM, a floppy (registered trademark) disk, a hard disk, a magnet-optical disk, an optical disk, such as, a CD-ROM, a CD-R, a CD-RW, a DVD (a DVD-ROM, a DVD-RAM, a DVD-RW, and a DVD+RW), a magnetic tape, a nonvolatile memory card, and other ROMs. Alternatively, the program code may be supplied to a computer by downloading the program code from, for example, another computer or a database (not shown) connected to the Internet, a commercial network, a local area network, or other networks.

The functions obtained in the embodiment described above are achieved not only by executing the program code read by the computer, but also by causing an OS (operating system) or any other program running on the CPU to perform part or all of the actual processes based on instructions of the program code.

Further, the functions obtained in the embodiment described above may also be achieved by writing the program code read from a storage medium to a memory provided in a function expansion board inserted into a computer or a function expansion unit connected to the computer, and causing a CPU or other devices provided in the function expansion board or the function expansion unit to perform part or all of the actual processes based on instructions issued from the program code.

The program code may be provided, for example, in the form of object code, program code executed by an interpreter, and script data supplied to an OS.

An Example of the present invention will now be described.

Example

First, in the vacuum processing apparatus 10, the present inventor removed the shower head 29 from the chamber 11, exchanged all the components in the chamber 11 for brand new ones, and performed cleaning by wiping the components. Twelve hours were allowed to elapse, and the shower head 29 was attached to the chamber 11, followed by the depressurization process shown in FIG. 3. The time required to lower the pressure in the chamber 11 to a target pressure of $1.3 \times 10^{-3}$ Pa was measured. The measurement showed that the required time was three hours and thirty minutes.

Comparative Example

The present inventor cleaned the components as in the Example, waited for twelve hours, and attached the shower head 29 to the chamber 11. The DP and the TMP were then used to evacuate the chamber 11 in a monotonous manner. The time required to lower the pressure in the chamber 11 to the target pressure of $1.3 \times 10^{-3}$ Pa was measured, as in the Example. The measurement showed that the required time was at least five hours.

The Example and Comparative Example have shown that performing the depressurization process in FIG. 3 can greatly reduce the evacuation time.

What is claimed is:

1. An evacuation method for a vacuum processing apparatus including a vacuum processing chamber, the method comprising:
   a first pressure adjustment step of maintaining the pressure in the vacuum processing chamber during the evacuation at a first pressure which is not less than $6.7 \times 10^2$ Pa and not more than $13.3 \times 10^2$ Pa; and
   a second pressure adjustment step of elevating the pressure in the vacuum processing chamber to a second pressure which is higher than the first pressure and in a range between $1.3 \times 10^4$ Pa and $2.7 \times 10^4$ Pa,
   wherein said first pressure adjustment step and said second pressure adjustment step are repeated.

2. The evacuation method according to claim 1, wherein a heated gas or a room-temperature inert gas is introduced into the vacuum processing chamber.

3. The evacuation method according to claim 1, wherein a moisture decomposing gas is introduced into the vacuum processing chamber.

4. The evacuation method according to claim 3, wherein the moisture decomposing gas comprises at least one selected from a group consisting of iodomethylpropane, acetyl chloride, acetone diacyl acetal, dichloropropane, dimethylpropane, dibromopropane, trimethyldisilane, dimethyldichlorosilane, monomethyltrichlorosilane, and tetrachlorosilane.

5. The evacuation method according to claim 1, wherein the atmosphere in the vacuum processing chamber is replaced with a low oxygen partial pressure atmosphere.

6. The evacuation method according to claim 5, wherein during the replacement with the low oxygen partial pressure atmosphere, the atmosphere in the vacuum processing chamber is circulated via an oxygen partial pressure super-reduction pipe which is made of a solid electrolyte, an inner surface of which is covered with a platinum electrode, and to which a DC voltage is applied so as to produce a potential difference between the inner surface and an outer surface thereof.

7. The evacuation method according to claim 1, wherein the wall and the component surfaces of the vacuum processing chamber are heated.

8. The evacuation method according to claim 1, wherein a cryopump capable of evacuating the vacuum processing chamber is disposed therein, and wherein the evacuation is continued after the repetition of said first pressure adjustment step and said second pressure adjustment step to depressurize the vacuum processing chamber to $1.3 \times 10$ Pa or lower, and the cryopump is then activated.

9. The evacuation method according to claim 1, further comprising the steps of:
   continuing the evacuation after the repetition of said first pressure adjustment step and said second pressure adjustment step to depressurize the vacuum processing chamber to $1.3 \times 10^{-2}$ Pa or lower; and
   repeating a third pressure adjustment step of introducing an inert gas into the vacuum processing chamber while evacuating the vacuum processing chamber and a fourth pressure adjustment step of discharging the inert gas in the vacuum processing chamber to depressurize the vacuum processing chamber to $1.3 \times 10^{-2}$ Pa or lower.

10. An evacuation method for a vacuum processing apparatus including a vacuum processing chamber, the method comprising:
    a depressurization step of depressurizing the vacuum processing chamber without causing the moisture in the vacuum processing chamber to solidify, the pressure in the vacuum processing chamber being maintained at a first pressure which is not less than $6.7 \times 10^2$ Pa and not more than $13.3 \times 10^2$ Pa in said depressurization step; and
    a pressure elevation step of elevating rapidly the pressure in the vacuum processing chamber to a second pressure which is higher than the first pressure and in a range between $1.3 \times 10^4$ Pa and $2.7 \times 10^4$ Pa so as to allow adiabatic compression to occur in the vacuum processing chamber,
    wherein said depressurization step and said pressure elevation step are repeated.

11. An evacuation method for a vacuum processing apparatus including a vacuum processing chamber, the method comprising:
    a first pressure adjustment step of maintaining the pressure in the vacuum processing chamber during the evacuation at a first pressure which is not less than $6.7 \times 10^2$ Pa and not more than $13.3 \times 10^2$ Pa by evacuating an interior of the vacuum processing chamber; and
    a second pressure adjustment step of elevating rapidly the pressure in the vacuum processing chamber to a second pressure which is in a range between $1.3 \times 10^4$ Pa and $2.7 \times 10^4$ Pa and higher than the first pressure by supplying a gas into the vacuum processing chamber, wherein
    said first pressure adjustment step and said second pressure adjustment step are repeated.

12. The evacuation method according to claim 11, wherein in said second pressure adjustment step, a heated gas or a room-temperature inert gas is supplied into the vacuum processing chamber.

13. The evacuation method according to claim 11, further comprising a heating step of heating wall and component surfaces of the vacuum processing chamber.

14. The evacuation method according to claim 11, further comprising:
    a third pressure adjustment step of introducing an inert gas into the vacuum processing chamber following the repetition of said first pressure adjustment step and said second pressure adjustment step whereas continuing the evacuating after the pressure in the vacuum processing chamber becomes lower than $1.3 \times 10$ Pa; and
    a fourth pressure adjustment step of discharging an inert gas in the vacuum processing chamber to decrease rapidly the pressure in the vacuum processing chamber to $1.3 \times 10^{-2}$ Pa or lower, wherein
    said third pressure adjustment step and said fourth pressure adjustment step are repeated.

15. The evacuation method according to claim 14, wherein after the pressure in the vacuum processing chamber becomes lower than $1.3 \times 10$ Pa, a cryopump is activated.

* * * * *